United States Patent [19]

Clapham

[11] Patent Number: 5,053,672
[45] Date of Patent: Oct. 1, 1991

[54] ENERGY CONVERTER APPARATUS

[76] Inventor: Thomas J. Clapham, 2823 - 18th Ave. North, Minneapolis, Minn. 55411

[21] Appl. No.: 529,625

[22] Filed: May 29, 1990

[51] Int. Cl.$^5$ ............................................. H01L 71/08
[52] U.S. Cl. ................................... 310/334; 310/338; 310/339; 322/2 R
[58] Field of Search ....................... 310/334, 338, 339; 322/2 R

[56] References Cited

U.S. PATENT DOCUMENTS

| | | | |
|---|---|---|---|
| 3,317,762 | 5/1967 | Corwin | 310/334 |
| 3,325,743 | 6/1967 | Blum | 310/334 |
| 3,463,942 | 8/1969 | Mellon | 310/339 |

*Primary Examiner*—Mark O. Budd
*Assistant Examiner*—Thomas M. Dougherty

[57] ABSTRACT

An energy converter includes a vibrating structure formed of metallic or ceramic material and including a spherical member having a spherical opening located concentrically therein. The vibrating structure is cooled by liquid hydrogen and the spherical opening contains a spherical outer member formed of ceramic and containing piezoelectric crystals embedded therein. An intermediate spherical member formed of an insulator material is positioned concentrically within the outer spherical member, and an inner sectional spherical member is positioned within the intermediate spherical member. The sectional spherical member is comprised of a plurality of laminated sections, each including inner, outer, and intermediate elements. Suitable conductors connect the innere and outer elements of the sectional spherical member with a source of electrical current. A spherical core member is positioned interiorly of the sectional spherical member and is formed of a non-fusion material (does not heat up on impact). When the sectional spherical member is energized by an electrical current, the respective sections of the sectional spherical member vibrate, producing radially directed pressure waves that cause vibrations of the intermediate and outer spherical members of the spherical vibrating structure. Inwardly directed radially propagated pressure waves are transmitted from the vibrating structure to the core member, which undergoes a slightly implosive effect to intensify outwardly directed radial pressure waves. The outwardly directed radial pressure waves produce alternate expansion and compression of the piezoelectric crystals in the outer spherical member to thereby produce electrical current for use as available energy.

2 Claims, 2 Drawing Sheets

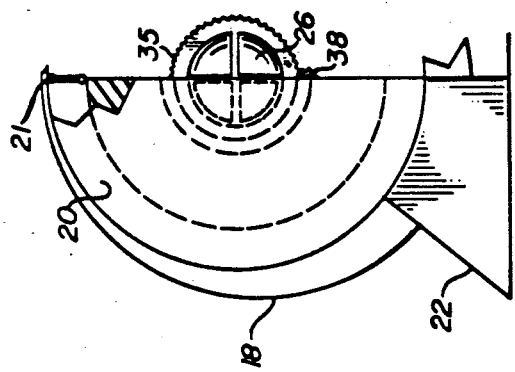
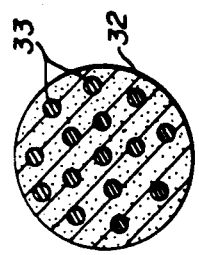
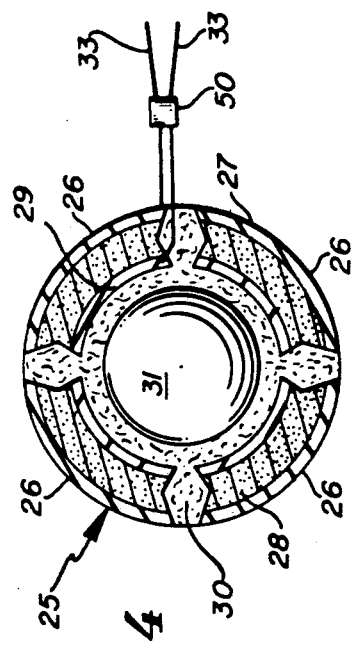
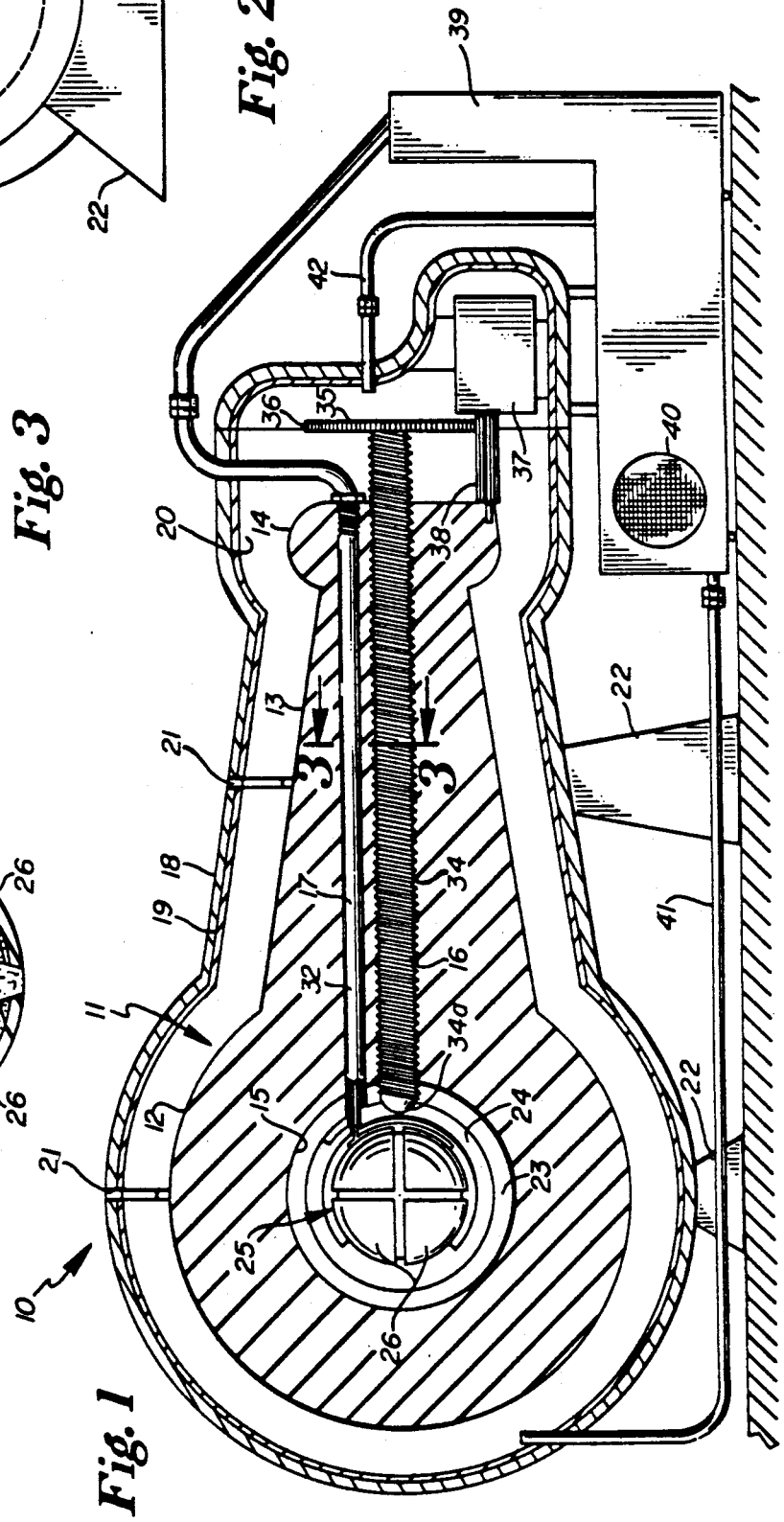

ENERGY CONVERTER APPARATUS

FIELD OF THE INVENTION

This invention relates to an energy converter apparatus.

SUMMARY OF THE INVENTION

It is an object of this invention to provide an experimental energy converter apparatus which releases kinetic energy from matter for producing electrical wave lengths having an output greater than the input by converting some of the mass of the core into kinetic energy through controlled implosion of the core. The core is made of a special material that is conducive to implosion on a gradual basis under very low temperatures in response to high impact pressures on the core. I believe that the best implosive materials to be used in this apparatus are materials similar to those observed in burned out stars but of course found on the earth such as 56FE or Si for those are the materials that cannot respond to radial impact with heat or fusion so must respond in the presence of cold and radial impact by releasing kinetic energy and will not stifle the reaction with heat or cause impurities of course dense materials such as HG are also open to experiment but it is the basic materials that are exposed to heat for billions of years that are vulnerable to cold and pressure in releasing their energy. With the combination of very low temperature and high impact pressure, enough of the orbital energy in these certain impact implodable materials can be converted into kinetic energy. As is well known, this process of implosion is not new, for the first atomic bomb was a similar device but rather than the radially directed impact vibrating structure it consisted of an implosive jacket encased in a steel chamber many inches thick with uranium or some other fissionable material inside of the implosive jacket.

When the bomb was detonated, the uranium was acted upon by implosion, and part of this material was converted into radial kinetic, magnetic and radiant energy. The basic improvement of my invention as described involves the substitution of materials of implosion for those of violent explosion which produces a gradual and controlled emission of energy pulses from radially directed vibrations. These radially directed vibrations are converted into useful motion through off centered implosion or electricity in such a way as to maintain a useful voliticity of the reaction but yet at the same time preventing chain fire run away implosion or explosion. Thereby no radiation can pass through the center of implosion and all dispersion of energy will be inward through the center rather than outward whereby only radial kinetic energy which is the purest form of energy will be generated.

This suppression of radiance and heat is believed to be accomplished by a format of extreme cold and pressure upon apparatus which includes a vibrating structure which is cooled by liquid hydrogen and which includes a spherical member and a tapered member integral with the spherical member. The spherical member has a spherical opening in the center portion thereof in which is positioned a surrounding spherical ceramic member having piezo-electric crystals embedded therein.

A metallic intermediate spherical member is positioned interiorly of the ceramic spherical member and is disposed in contacting relation with the latter. A sectional spherical capacitive member is positioned interiorally of the intermediate spherical member in contact therewith. The capacitive member is formed of a plurality of sections each including inner, outer and intermediate elements. The inner and outer elements of the capacitive member are formed of a conductive material separated by the intermediate elements which are formed of a diaelectric material. Electrical conductors are connected to the inner and outer members of each of the capacitive member sections with shunting switches which are connected across these inner and outer sections and to a source of electrical energy. It should be noted that in order to perpetuate the implosive pressure waves the capacitator must discharge exactly when the pressure wave is inside the capacitator otherwise the general function of the vibrating structure will be inconsistent and self conflicting.

A core member is positioned interiorally of the spherical capacitive member and is formed of a material such as 56FE or Si. This material produces kinetic energy when it is acted upon by radially vibrating pressure waves initiated by the shunting of the spherical condensor to thereby start, maintain, and perpetuate a vibrating electric generating function through the appropriate charging and shunting of the capacitors. This function perpetuated by the reaction of the directed radial impacts on said implodable material.

When the capacitive sectional members are energized with the electric current, the sections will vibrate through this charging and discharging method, and these vibrations will be transmitted radially inwardly and outwardly. The outwardly transmitted radial vibrations will be transmitted via the intermediate spherical member and the ceramic spherical member to the outer spherical member to reverse themselves at the surface of the vibrating structure.

The inwardly directed vibrations or compression waves from the spherical member of the vibrating structure will intensify as a result of these vibrating waves in a sympathetic mode with the inwardly directed vibrations generated by the capacitor intermediate sectional spherical members to thereby cause gradual implosion of the core member (releasing kinetic energy pulses also resonant to empower or perpetuate the reaction). The core member generates intense vibrations in sympathetic accord to prior vibrations which result in embelishing alternate compression and expansion waves within the ceramic spherical member to produce electrical pulses from the embedded piezo-electric crystals surrounding the condenser. This energy is greater than input energy and can be used as a source of operating power for various devices. The compression screw is adjustable to accommodate compression of the implodable material. Some of the current is fed back into the capacitor from the piezo-electric crystals to sustain and control said vibrations.

FIGURES OF THE DRAWING

FIG. 1 is a longitudinal sectional view of the novel energy converter apparatus;

FIG. 2 is a cross-sectional view of the apparatus illustrating details of construction;

FIG. 3 is a cross-sectional view taken approximately along line 3—3 of FIG. 1 and looking in the direction of the arrows; and FIG. 4 is a fragmentary cross-sectional view of a portion of the apparatus illustrating details of construction thereof.

DESCRIPTION OF THE PREFERRED EMBODIMENT

Figure 5:
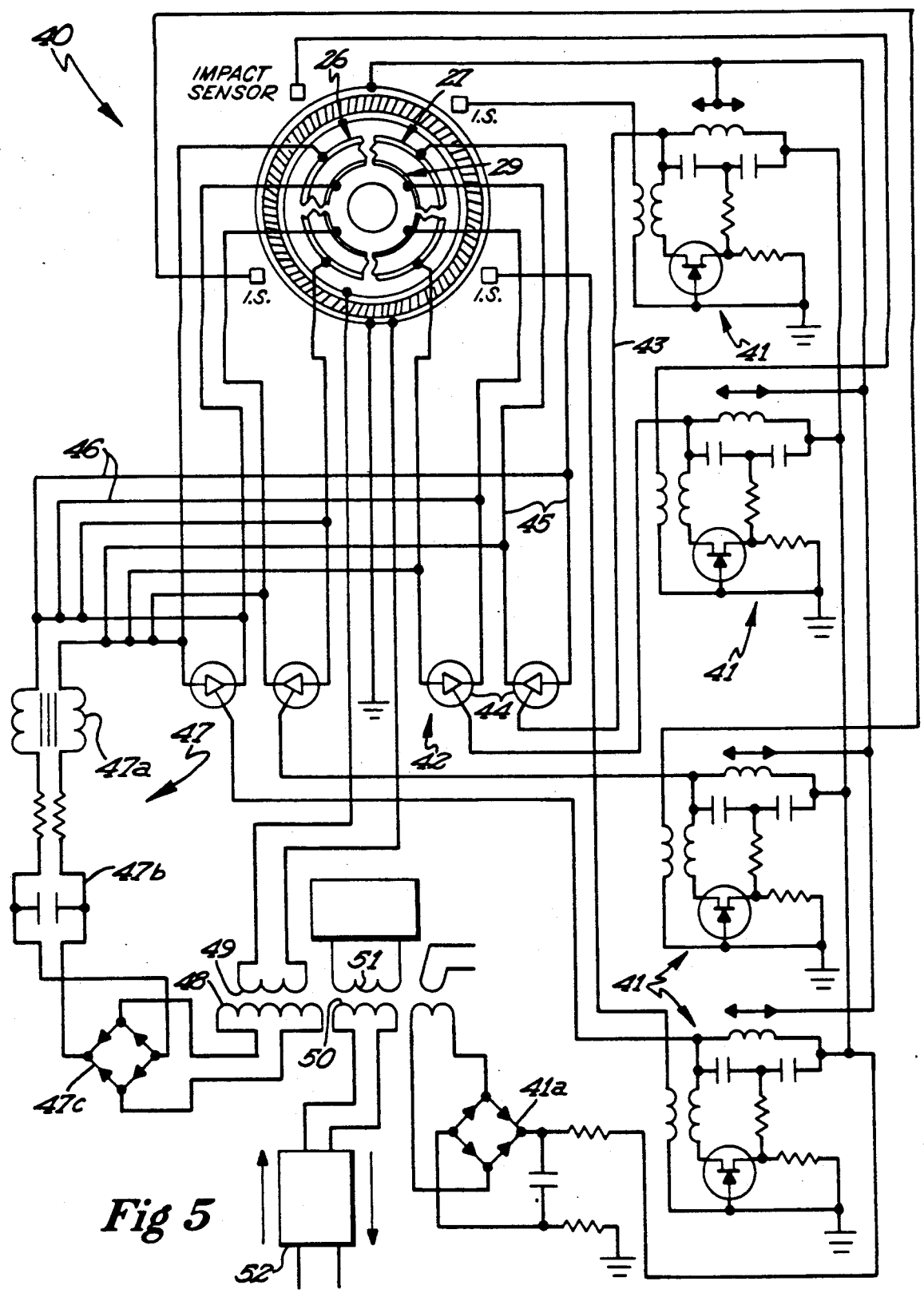
FIG. 5 is a schematic diagram of the electrical circuitry for the apparatus.

Referring now to FIG. 1, it will be seen that one embodiment of the novel energy converter apparatus, designated generally by the reference numeral 10, is thereshown. The apparatus includes a vibrating structure 11 formed of a suitable metal alloy, such as titanium or non-magnetic steel or ceramic. The vibrating structure includes a cylindrical spherical member 12 having an elongate tapering member 13 integrally formed therewith and projecting therefrom. It will be seen that the tapering member 13 terminates in an enlarged end 14.

The spherical member 12 of the vibrating structure has a spherical cavity 15 therein, which is disposed in concentric relation with the spherical member 12. The tapering member 13 also has a threaded axial opening 16 therein, which extends through the enlarged end portion 14 and communicates with the spherical cavity 15. The tapering member 13 also has a threaded axially extending secondary opening 17 therethrough which also extends through the enlarged end portion 14 and communicates with the spherical cavity 15. The secondary opening 17 is smaller in cross-sectional size than the threaded axial opening 16.

The apparatus 10 also includes a metal jacket 18, which is positioned around the vibrating structure 11 and spaced therefrom by suitable support elements 21. It will be seen that the support elements 21 extend between the metal jacket 18 and the vibrating structure 11. A thermal insulator 19 engages the inner surface of the metal jacket 18 and is spaced outwardly of the exterior surface of the vibrating structure 11. The volumetric space defined between the thermal insulator 19 and the vibrating structure 11 defines a liquid hydrogen chamber 20. The apparatus 10 is supported by suitable longitudinally spaced apart base support elements 22 which engage the metal jacket 18 and which may be supported upon a suitable support surface, such as a floor or the like.

Positioned interiorly of the spherical cavity 15 in the vibrating structure 11 is an outer spherical member 23, which is formed of a suitable ceramic material having piezoelectric crystals embedded therein. The exterior surface of the ceramic spherical member 23 engages the inner surface of the vibrating structure, which defines the spherical cavity 15. An intermediate spherical member 24 formed of stainless steel is positioned interiorly of the ceramic spherical member 23, and the outer surface of the intermediate spherical member 24 engages the inner surface of the ceramic sphere 23.

A capacitive sectional spherical member 25 is positioned interiorly of the intermediate spherical member 24, and the capacitive spherical member 25 is formed of a plurality of sections 26. FIG. 4 is a diagrammatic cross-sectional illustration of these sections, and it will be seen that each section 26 is somewhat trapezoidal in cross-sectional configuration. Each section 26 includes an outer inductor element 27 formed of copper, a dielectric intermediate layer 28, and an inner inductor element 29 formed of copper. The inner and outer inductor elements of each section 26 are connected by suitable electrical conductors 33 to a source of electrical current by means of the control panel 39. A switch 50 is disposed in circuit controlling relation with respect to the circuit of the associated section 26. The switching device is operable to charge or discharge the condensors. Segments of the condensors may be arranged through construction of the control panel 39 to operate independently of each other for controlling impact wave centers. With this arrangement, the input circuit for the capacitive spherical member charges the capacitive sections and permits a strong pulse discharge of these sections.

A solid inner spherical core member 31 is positioned concentrically within the capacitive spherical member 25 and is preferably formed of a non-heating material an impact material, such as silicon, copper, iron, or the like. The core member 31 is electrically insulated from the inner inductor element 29 of each capacitive section 26 by a heavy insulating material 30. The insulator material is also disposed between adjacent sections 26 of the capacitive spherical member 25.

Referring again to FIG. 1, it will be seen that an elongate cylindrically-shaped externally threaded ceramic member 32 extends through and threadedly engages the threaded secondary opening 17 of the vibrating structure said elongate member could be eliminated to improve clearion properties of said vibrating structure 12. The ceramic member 32 has a plurality of electrical conductors 33 embedded therein and being electrically connected to the control panel 39. It will be noted that certain of the electrical conductors 33 are interconnected to the inner and outer inductor elements of the capacitive spherical member 25 and that other electrical conductor elements 33 are connected to the piezo-electric crystals embedded in the ceramic sphere 23. The circuit to the capacitive spherical member 25 constitutes an input signal circuit, while the circuit including the piezoelectric crystals in the ceramic sphere 23 comprises an output signal circuit.

Referring again to FIG. 1, it will be seen that an elongate externally threaded pressure screw 34 threadedly engages and extends through the threaded opening 16 in the vibrating structure 12 and is disposed in engaging relation in a recess in the intermediate spherical member 24. The outer end of the pressure screw 34 has an enlarged head 35 which has teeth 36 formed throughout its circumference. A motor and gear box unit 37 is provided with an output shaft, which is rigidly connected to an axially extending drive gear 38. The drive gear 38 is disposed in meshing relation with the circumferential teeth 36 of the head 35. It will be seen that, when the gear motor box unit 37 is energized, the screw will be rotated in a direction to apply or relieve pressure on the intermediate spherical member 24. In this regard, it is pointed out that the motor and gear box unit 37 is of the reversible type.

The energy converter apparatus 10 includes a control panel 39 which contains the various electrical components for the apparatus. The control panel is connected to a source of electrical current and supplies direct current to the capacitive spherical member 25. The energy converter apparatus FIG. 1 also includes a liquid hydrogen generator 40 for producing liquid hydrogen, which is supplied to the liquid hydrogen chamber 20. In this regard, the liquid hydrogen generator has one end of an elongate supply conduit 41 connected thereto in communicating relation and the other end of the supply conduit 41 is connected in communicating relation with the chamber 20. One end of an elongate return conduit 42 is connected in communicating relation with the liquid hydrogen chamber 20 and the other end thereof is connected to the hydrogen generator 40. With this arrangement, liquid hydrogen is supplied to the chamber to maintain the vibrating structure 12 in an extremely cold condition.

When the capacitive spherical member 25 is energized with an electrical current, it will vibrate by charging and shunting and these vibrations will be directed radially inwardly and radially outwardly. The vibrating structure is so arranged in normal use so all inwardly or outwardly directed vibrations will be in a sympathetic mode with each other resonant to the natural ringing frequency of the materials in the vibrating structure, and will be amplified in intensity through spherical members, 23, 24, 26, and 31. As a reaction from these radially directed pressure waves on the implodable material as these radially directed pressure waves release kinetic energy on their impacts on this material.

These intensified vibrations will be transmitted to the core member 31, which produces an implosive effect on this core member. This implosive effect intensifies the outwardly generated vibrations from the core member, and these radially outwardly directed vibrations will increase the vibrating wave form as it passes outwardly through outer spherical member 23. The outer spherical member 23 will experience compression and expansion from the radial vibrations. The intense compression and expansion effects of the outer spherical member 23 will be transmitted to the piezoelectric crystals embedded therein, and this will produce an electrical current, which will be transmitted by electrical conductors 33. This electrical current generated may be used as a source of power. It is believed that the total energy output is slightly greater than the total energy input depending on the volatility of implosive material and the efficiency of the operation.

The pressure screw 34 may be rotated in either a clockwise or counterclockwise direction to increase or decrease the pressure exerted on the intermediate spherical member 24. By changing the pressure on the intermediate spherical member 24, the compression and expansion characteristics caused by the vibrations of the system may be changed. It should be noted that the elongate member 13 and 14 could be eliminated from the main body if a strong enough material for the main body could be found. I believe that this would improve the clearion properties of the system and the ease of centering of the impact waves if the main body were reduced to a perfect sphere.

Referring now to FIG. 5 of the drawing, it will be seen that the electric circuitry, designated generally by the reference numeral 40, is there shown. The electric circuitry includes a plurality of oscillator circuits 41 which are electrically connected to an outer inductor element 27 of a capacitive section 26 and which are electrically connected by conductor 43 to one of a plurality of silicon controlled rectifiers 42. The gate 44 of the silicon controlled rectifier 42 is also electrically connected by electrical conductors 45 to the outer inductor element 27 and the inner inductor element 29 of a capacitive section 26.

Each SCR circuit to a capacitive section 26 of the capacitive spherical member 25 is electrically connected by electrical conductors 45 to the power supply device 47. The power supply device 47 includes a filter reactor 47a which is electrically connected through filter resistors to a filter condensor 47b. The power supply device 47, also includes a bridge circuit 47c which serves as a rectifier and is electrically connected to the winding 48 of transformer including seconding windings 49. (in the starting mode).

Power for operating the apparatus is electrically connected to a frequency converter 52 which is electrically connected to the primary windings 50 of the transformer which includes a secondary windings 51. A rectifier circuit 41a is electrically connected to the oscillator circuits 41. It is pointed out that the apparatus includes 8 oscillator circuits and 8 SCR circuits are shown, each circuit being electrically connected to one of the capacitive sections 26.

During starting phase of the apparatus, energy is supplied through the frequency converter and across the transformer winding 50, to energize the oscillator, refrigeration circuits, and SCR circuit of the apparatus. The power supply device 47 is also energized in the operating phase to produce the initial vibration and ringing of the vibrating structure. The oscillator circuits 41 and the SCR circuits 42 coordinate the firing phase so that the vibrating wave produced in the vibrating structure are in a phase with each other. Therefore the piezo-electric crystals in the capacitive sections will be substantially uniformally controlled in their vibrations. Electrical current is produced due to vibrations of the piezo-electrical crystals and this current is transmitted across the winding 49. When the wattage across the winding 49 exceeds the wattage across the windings 50, current will be directed to the line through the frequency converter. The output of the energy converter wattage will exceed the input wattage of the line and thereby embelishing voltage.

What is claimed is:

1. A mass energy converter apparatus comprising:
   a vibrating structure formed of metal or ceramic and including a spherical member and an elongate tapering member integral with said spherical member and extending outwardly therefrom, said spherical member having a hollow spherical chamber therein,
   a rigid jacket positioned exteriorly of and spaced outwardly of said vibrating structure to define a cooling chamber therebetween,
   a source of liquid hydrogen connected in communicating relation with said cooling chamber to permit evaporating hydrogen to circulate through the cooling chamber thereby cooling the vibrating structure,
   a spherical ceramic member positioned within the cavity in the vibrating structure and engaging the inner surface thereof, said ceramic member having a plurality of piezo-electric crystals embedded therein, electrical conductors connected to said crystal and extending outwardly therefrom,
   an intermediate spherical member formed of metal and positioned interiorly of said ceramic member in engaging relation with the latter,
   a sectional laminated capacitive structure positioned interiorly of said intermediate member and being comprised of a plurality of substantially identical sections, said sections engaging the interior of said intermediate spherical member and being arranged to define a sphere, each section of said capacitive structure including an inner layer, an outer layer, and an intermediate layer disposed between said inner and outer layers, said inner and outer layers being formed of electrically conductive material and said intermediate layer being formed of a dielectric material, a plurality of electrical conductors, each being connected to one of said inner and outer layers, and each being connected to a source of electric current, insulating means disposed around the periphery of each of said sections, and a core member formed of an explodable material and positioned interiorly of said capacitive structure whereby, when said capacitive structure is electrically energized, said capacitive structure will produce inwardly and outwardly directed vibrations to thereby cause said spherical member of said vibrating structure, said ceramic member and said intermediate spherical member to vibrate, said vibrations being transmitted to said core member to cause slight implosion of the latter, to thereby release radial kinetic energy, and outwardly directed intensified vibrations for alternately compressing and expanding the ceramic member and thereby producing electrical wave lengths in response to compression and expansion of said piezoelectric crystals as a part of the reaction.

2. The invention as defined in claim 1 and a pressure screw for selectively adjusting compression of the core member.

* * * * *